United States Patent
DeLaCruz et al.

(10) Patent No.: US 12,272,730 B2
(45) Date of Patent: Apr. 8, 2025

(54) TRANSISTOR LEVEL INTERCONNECTION METHODOLOGIES UTILIZING 3D INTERCONNECTS

(71) Applicant: Adeia Semiconductor Inc., San Jose, CA (US)

(72) Inventors: Javier A. DeLaCruz, San Jose, CA (US); David Edward Fisch, Pleasanton, CA (US)

(73) Assignee: Adeia Semiconductor Inc., San Jose, CA (US)

( * ) Notice: Subject to any disclaimer, the term of this patent is extended or adjusted under 35 U.S.C. 154(b) by 0 days.

(21) Appl. No.: 18/147,651

(22) Filed: Dec. 28, 2022

(65) Prior Publication Data
US 2023/0138732 A1    May 4, 2023

Related U.S. Application Data

(60) Continuation of application No. 17/217,104, filed on Mar. 30, 2021, now Pat. No. 11,688,776, which is a
(Continued)

(51) Int. Cl.
*H01L 29/66* (2006.01)
*H01L 21/02* (2006.01)
(Continued)

(52) U.S. Cl.
CPC .... *H01L 29/4175* (2013.01); *H01L 21/02532* (2013.01); *H01L 21/76275* (2013.01);
(Continued)

(58) Field of Classification Search
CPC ............... H01L 21/043; H01L 21/0485; H01L 29/45–458; H01L 29/7813;
(Continued)

(56) References Cited

U.S. PATENT DOCUMENTS

| 5,753,536 A | 5/1998 | Sugiyama et al. |
| 5,771,555 A | 6/1998 | Eda et al. |

(Continued)

FOREIGN PATENT DOCUMENTS

| JP | 2013-033786 A | 2/2013 |
| JP | 2018-160519 | 10/2018 |
| WO | WO 2005/043584 A2 | 5/2005 |

OTHER PUBLICATIONS

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

(Continued)

*Primary Examiner* — Moin M Rahman
(74) *Attorney, Agent, or Firm* — Knobbe, Martens, Olson & Bear, LLP (57) ABSTRACT

A microelectronic unit may include an epitaxial silicon layer having a source and a drain, a buried oxide layer beneath the epitaxial silicon layer, an ohmic contact extending through the buried oxide layer, a dielectric layer beneath the buried oxide layer, and a conductive element extending through the dielectric layer. The source and the drain may be doped portions of the epitaxial silicon layer. The ohmic contact may be coupled to a lower surface of one of the source or the drain. The conductive element may be coupled to a lower surface of the ohmic contact. A portion of the conductive element may be exposed at the second dielectric surface of the dielectric layer. The second dielectric surface may be directly bonded to an external component to form a microelectronic assembly.

6 Claims, 8 Drawing Sheets

Related U.S. Application Data division of application No. 16/265,456, filed on Feb. 1, 2019, now Pat. No. 10,991,804.

(60) Provisional application No. 62/650,220, filed on Mar. 29, 2018.

(51) Int. Cl.
| | |
|---|---|
| *H01L 21/762* | (2006.01) |
| *H01L 23/00* | (2006.01) |
| *H01L 23/538* | (2006.01) |
| *H01L 29/06* | (2006.01) |
| *H01L 29/08* | (2006.01) |
| *H01L 29/417* | (2006.01) |

(52) U.S. Cl.
CPC ...... *H01L 21/76283* (2013.01); *H01L 23/538* (2013.01); *H01L 24/11* (2013.01); *H01L 24/13* (2013.01); *H01L 29/0649* (2013.01); *H01L 29/0847* (2013.01); *H01L 29/66568* (2013.01); *H01L 24/05* (2013.01); *H01L 2224/0401* (2013.01); *H01L 2224/13016* (2013.01)

(58) Field of Classification Search
CPC ......... H01L 29/7825; H01L 29/66613–66628; H01L 29/42336; H01L 29/42352; H01L 29/4236; H01L 29/42356; H01L 29/66734; H01L 23/481; H01L 23/53238; H01L 25/0657; H01L 21/76898; H01L 21/0228; H01L 21/76831; H01L 21/76819; H01L 21/02274; H01L 21/76841; H01L 21/02164; H01L 23/5329; H01L 21/3212; H01L 2225/06541; H01L 2225/06517; H01L 2225/06513; H01L 2224/13023; H01L 2224/13024; H01L 2224/02372; H01L 2224/16145; H01L 2224/16227; H01L 24/13; H01L 24/16; H01L 23/53257; H01L 21/76877; H01L 21/31053; H01L 21/7684; H01L 21/02126; H01L 21/823807; H01L 21/823821; H01L 21/823418; H01L 21/823412; H01L 29/66439; H01L 29/66795; H01L 27/0886; H01L 29/78684; H01L 27/0924; H01L 21/823814; H01L 29/78618; H01L 21/823828; H01L 29/42392; H01L 29/78696; H01L 29/785; H01L 29/66545; H01L 29/78654; H01L 2029/7858; H01L 21/0245; H01L 21/823857; H01L 21/31051; H01L 27/0207; H01L 29/0649; H01L 21/32115; H01L 29/66681; H01L 29/0657; H01L 29/4966; H01L 29/0882; H01L 29/4983; H01L 29/1037; H01L 29/0653; H01L 29/66659; H01L 29/7835; H01L 29/66689; H01L 29/7816; H01L 21/28088; H10B 12/056; H10B 12/05; H10B 12/36; H10B 10/12; H10B 12/053; H10B 12/0383; H10B 12/395; H10B 20/30; H10B 41/41; H10B 41/43; H10B 41/49; H10B 61/22; H10B 63/34

See application file for complete search history.

(56) References Cited

U.S. PATENT DOCUMENTS

| | | | |
|---|---|---|---|
| 6,080,640 | A | 6/2000 | Gardner et al. |
| 6,320,225 | B1 | 11/2001 | Hargrove et al. |
| 6,423,640 | B1 | 7/2002 | Lee et al. |
| 6,465,892 | B1 | 10/2002 | Suga |
| 6,887,769 | B2 | 5/2005 | Kellar et al. |
| 6,908,027 | B2 | 6/2005 | Tolchinsky et al. |
| 7,045,453 | B2 | 5/2006 | Canaperi et al. |
| 7,105,980 | B2 | 9/2006 | Abbott et al. |
| 7,193,423 | B1 | 3/2007 | Dalton et al. |
| 7,372,101 | B2 | 5/2008 | Houston |
| 7,750,488 | B2 | 7/2010 | Patti et al. |
| 7,803,693 | B2 | 9/2010 | Trezza |
| 8,183,127 | B2 | 5/2012 | Patti et al. |
| 8,349,635 | B1 | 1/2013 | Gan et al. |
| 8,377,798 | B2 | 2/2013 | Peng et al. |
| 8,441,131 | B2 | 5/2013 | Ryan |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,524,533 | B2 | 9/2013 | Tong et al. |
| 8,620,164 | B2 | 12/2013 | Heck et al. |
| 8,647,987 | B2 | 2/2014 | Yang et al. |
| 8,697,493 | B2 | 4/2014 | Sadaka |
| 8,716,105 | B2 | 5/2014 | Sadaka et al. |
| 8,802,538 | B1 | 8/2014 | Liu |
| 8,809,123 | B2 | 8/2014 | Liu et al. |
| 8,841,002 | B2 | 9/2014 | Tong |
| 8,859,347 | B2 | 10/2014 | Stuber et al. |
| 9,093,350 | B2 | 7/2015 | Endo et al. |
| 9,142,517 | B2 | 9/2015 | Liu et al. |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,257,399 | B2 | 2/2016 | Kuang et al. |
| 9,299,736 | B2 | 3/2016 | Chen et al. |
| 9,312,229 | B2 | 4/2016 | Chen et al. |
| 9,331,149 | B2 | 5/2016 | Tong et al. |
| 9,337,235 | B2 | 5/2016 | Chen et al. |
| 9,385,024 | B2 | 7/2016 | Tong et al. |
| 9,394,161 | B2 | 7/2016 | Cheng et al. |
| 9,431,368 | B2 | 8/2016 | Enquist et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,620,481 | B2 | 4/2017 | Edelstein et al. |
| 9,656,852 | B2 | 5/2017 | Cheng et al. |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,799,587 | B2 | 10/2017 | Fujii et al. |
| 9,852,988 | B2 | 12/2017 | Enquist et al. |
| 9,893,004 | B2 | 2/2018 | Yazdani |
| 9,899,442 | B2 | 2/2018 | Katkar |
| 9,929,050 | B2 | 3/2018 | Lin |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 10,002,844 | B1 | 6/2018 | Wang et al. |
| 10,026,605 | B2 | 7/2018 | Doub et al. |
| 10,075,657 | B2 | 9/2018 | Fahim et al. |
| 10,204,893 | B2 | 2/2019 | Uzoh et al. |
| 10,269,756 | B2 | 4/2019 | Uzoh |
| 10,276,619 | B2 | 4/2019 | Kao et al. |
| 10,276,909 | B2 | 4/2019 | Huang et al. |
| 10,418,277 | B2 | 9/2019 | Cheng et al. |
| 10,446,456 | B2 | 10/2019 | Shen et al. |
| 10,446,487 | B2 | 10/2019 | Huang et al. |
| 10,446,532 | B2 | 10/2019 | Uzoh et al. |
| 10,508,030 | B2 | 12/2019 | Katkar et al. |
| 10,522,499 | B2 | 12/2019 | Enquist et al. |
| 10,707,087 | B2 | 7/2020 | Uzoh et al. |
| 10,784,191 | B2 | 9/2020 | Huang et al. |
| 10,790,262 | B2 | 9/2020 | Uzoh et al. |
| 10,840,135 | B2 | 11/2020 | Uzoh |
| 10,840,205 | B2 | 11/2020 | Fountain, Jr. et al. |
| 10,854,578 | B2 | 12/2020 | Morein |

(56) References Cited

U.S. PATENT DOCUMENTS

| | | |
|---|---|---|
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,296,053 B2 | 4/2022 | Uzoh et al. |
| 11,329,034 B2 | 5/2022 | Tao et al. |
| 11,348,898 B2 | 5/2022 | DeLaCruz et al. |
| 11,355,404 B2 | 6/2022 | Gao et al. |
| 11,355,443 B2 | 6/2022 | Huang et al. |
| 11,367,652 B2 | 6/2022 | Uzoh et al. |
| 11,373,963 B2 | 6/2022 | DeLaCruz et al. |
| 11,380,597 B2 | 7/2022 | Katkar et al. |
| 11,385,278 B2 | 7/2022 | DeLaCruz et al. |
| 11,387,202 B2 | 7/2022 | Haba et al. |
| 11,387,214 B2 | 7/2022 | Wang et al. |
| 11,393,779 B2 | 7/2022 | Gao et al. |
| 11,462,419 B2 | 10/2022 | Haba |
| 11,476,213 B2 | 10/2022 | Haba et al. |
| 11,515,291 B2 | 11/2022 | DeLaCruz et al. |
| 11,688,776 B2 * | 6/2023 | Delacruz ........... H01L 21/76275 257/347 |
| 2003/0022430 A1 * | 1/2003 | Emrick ............. H01L 29/66848 257/E21.12 |
| 2004/0084414 A1 | 5/2004 | Sakai et al. |
| 2006/0057945 A1 | 3/2006 | Hsu et al. |
| 2007/0111386 A1 | 5/2007 | Kim et al. |
| 2008/0054313 A1 * | 3/2008 | Dyer ................ H01L 21/76898 257/E21.597 |
| 2014/0175655 A1 | 6/2014 | Chen et al. |
| 2014/0273386 A1 * | 9/2014 | Tsao ................. H01L 21/76814 438/301 |
| 2015/0064498 A1 | 3/2015 | Tong |
| 2015/0187751 A1 | 7/2015 | Quaglietta et al. |
| 2016/0343682 A1 | 11/2016 | Kawasaki |
| 2018/0012850 A1 | 1/2018 | Cheng et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0115277 A1 | 4/2019 | Yu et al. |
| 2019/0131277 A1 | 5/2019 | Yang et al. |
| 2019/0333550 A1 | 10/2019 | Fisch |
| 2019/0385935 A1 | 12/2019 | Gao et al. |
| 2020/0013765 A1 | 1/2020 | Fountain, Jr. et al. |
| 2020/0035641 A1 | 1/2020 | Fountain, Jr. et al. |
| 2020/0294908 A1 | 9/2020 | Haba et al. |
| 2020/0328162 A1 | 10/2020 | Haba et al. |
| 2020/0395321 A1 | 12/2020 | Katkar et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | DeLaCruz et al. |
| 2021/0193624 A1 | 6/2021 | DeLaCruz et al. |
| 2021/0193625 A1 | 6/2021 | Katkar et al. |
| 2021/0217858 A1 | 7/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |

(56) References Cited

U.S. PATENT DOCUMENTS

| | | |
|---|---|---|
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |

OTHER PUBLICATIONS

Moriceau, H. et al., "Overview of recent direct wafer bonding advances and applications," Advances in Natural Sciences—Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Plobi, A. et al., "Wafer direct bonding: tailoring adhesion between brittle materials," Materials Science and Engineering Review Journal, 1999, R25, 88 pages.

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "Onsemi AR0820.".

Sony IMX260 images, showing various cross sections and materials analyses for a hybrid bonded back side illuminated CMOS image sensor. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image." (8 pages).

\* cited by examiner

TRANSISTOR LEVEL INTERCONNECTION METHODOLOGIES UTILIZING 3D INTERCONNECTS

CROSS-REFERENCE TO RELATED APPLICATIONS

The present application is a continuation of U.S. patent application Ser. No. 17/217,104, filed Mar. 30, 2021, which is a divisional of U.S. patent application Ser. No. 16/265,456, filed Feb. 1, 2019, which claims the benefit of the filing date of U.S. Provisional Patent Application No. 62/650,220, filed Mar. 29, 2018. The disclosures of the above applications are hereby incorporated by reference in their entireties.

BACKGROUND OF THE INVENTION

Microelectronic devices generally comprise a thin slab of a semiconductor material, such as silicon or gallium arsenide, commonly called a die or a semiconductor chip. In some unit designs, the semiconductor chip is mounted to a substrate or chip carrier, which is in turn mounted on a circuit panel, such as a printed circuit board.

In one face of the semiconductor chip is active circuitry. To facilitate electrical connection to the active circuitry, the chip is provided with bond pads on the same face. The bond pads are typically placed in a regular array either around the edges of the die or, for many memory devices, in the die center.

Figure 1A:
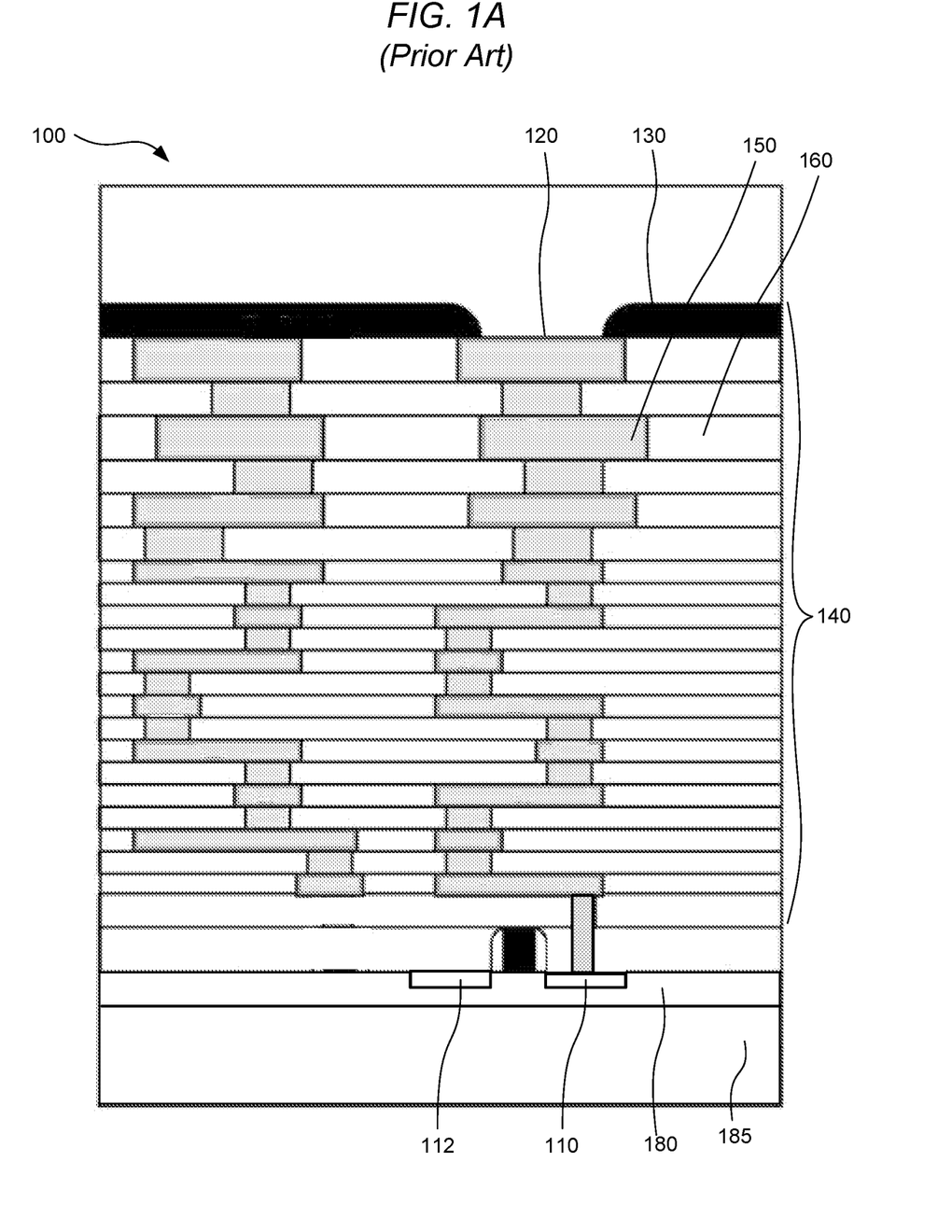
FIGS. 1A-B illustrate examples of conventional FD-SOI transistors, in which the drain of each is accessed via conductive interconnects extending through numerous dielectric layers.
Figure 1B:
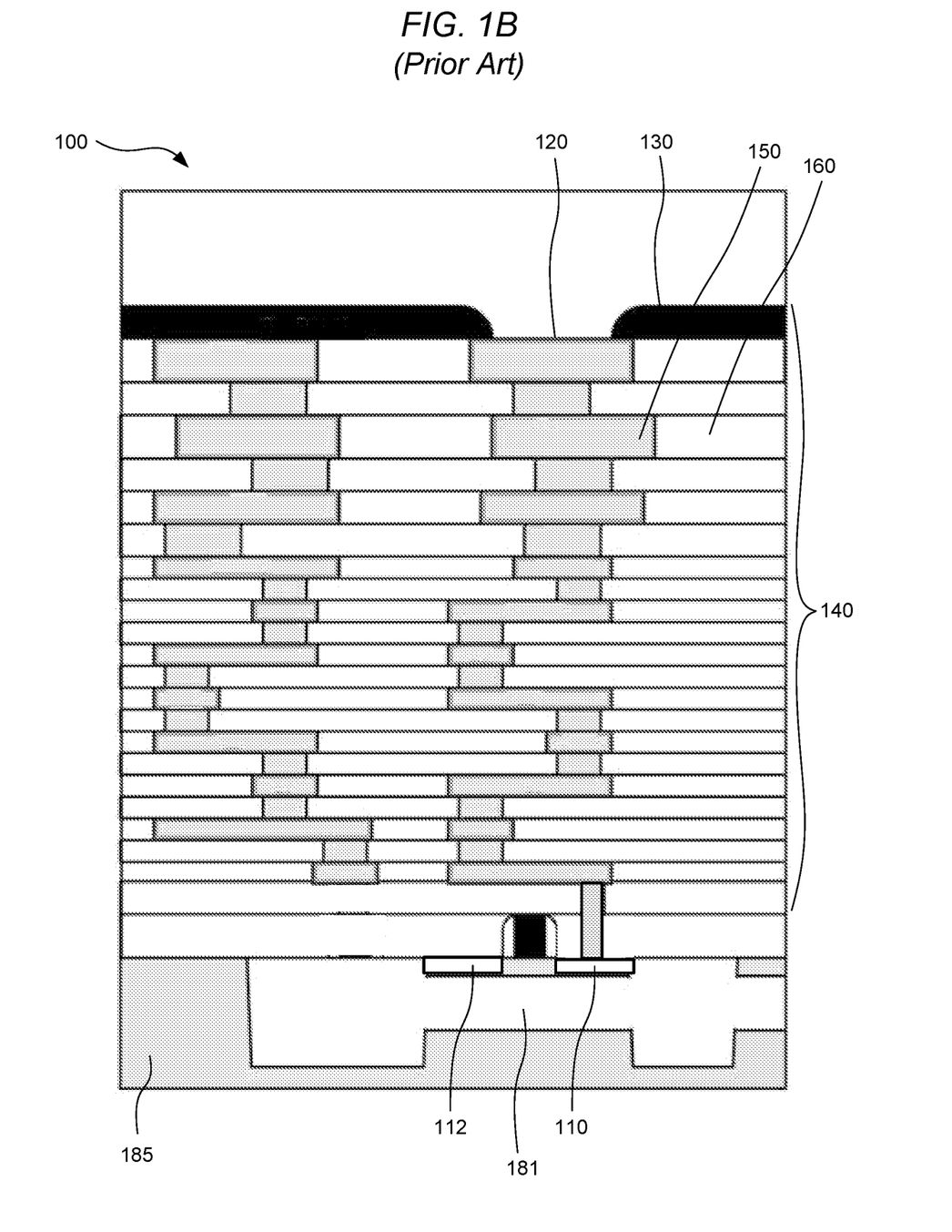

The sources and drains of fully-depleted silicon-on-insulator ("FD-SOI") transistors are typically electrically accessed via conductive interconnects extending above the front surface of the top layer of silicon, in which the transistors are formed. For example, FIG. 1A illustrates a first microelectronic unit 100 having a source 112 and a drain 110, wherein the drain 110 is electrically connected to a bond pad 120 exposed through an opening at a top surface 130 of a front dielectric layer assembly 140. The electrical connections include traces 150 that extend through numerous dielectric layers 160 of the front dielectric layer assembly 140 that overlie the buried oxide layer 180 on a silicon body layer 185. FIG. 1B illustrates a similar assembly wherein the buried oxide layer 181 is patterned to form isolation trenches on either side of the source 112 and drain 110. Despite the advances that have been made in access to the source and drain of FD-SOI transistors, there is still a need for further improvements.

BRIEF SUMMARY OF THE INVENTION

A microelectronic unit according to an aspect of the invention may include an epitaxial silicon layer having a front silicon surface and a back silicon surface opposite the front silicon surface, a buried oxide layer having a top oxide surface and a bottom oxide surface opposite the top oxide surface, such that the top oxide surface faces the back silicon surface, an ohmic contact extending through the buried oxide layer between the top and bottom oxide surfaces, one or more dielectric layers collectively having a first dielectric surface and a second dielectric surface opposite the first dielectric surface, such that the first dielectric surface faces the bottom oxide surface, and one or more conductive elements extending through the one or more dielectric layers between the first and second dielectric surfaces.

The epitaxial silicon layer may be epitaxially grown over the buried oxide layer, and may have a source and a drain each extending from the front silicon surface to the back silicon surface. The source and the drain may be doped portions of the epitaxial silicon layer. The top surface of the buried oxide layer may be coupled to the back surface of the epitaxial silicon layer. For example, the epitaxy may be grown over the buried oxide layer. The ohmic contact may be coupled to a lower surface of one of the source or the drain.

The one or more dielectric layers may be deposited onto the bottom surface of the buried oxide layer. The conductive element may include metallization in the one or more dielectric layers that is deposited to contact a lower surface of the ohmic contact. A portion of the conductive element may be exposed at the second dielectric surface and may be configured to be coupled to an external component.

A microelectronic unit according to another aspect of the invention may include an epitaxial silicon layer having a front silicon surface and a back silicon surface opposite the front silicon surface, a bulk silicon layer having a top bulk surface and a bottom bulk surface opposite the top bulk surface, an ohmic contact extending through the bulk silicon layer between the top and bottom bulk surfaces, one or more dielectric layers collectively having a first dielectric surface and a second dielectric surface opposite the first dielectric surface, the first dielectric surface in contact with the bottom bulk surface and one or more conductive elements extending through the one or more dielectric layers between the first and second dielectric surfaces.

The epitaxial silicon layer may have a source and a drain each extending between the front and back silicon surfaces. The source and the drain may be doped portions of the epitaxial silicon layer. The top bulk surface of the bulk silicon layer may be directly in contact with the back silicon surface of the epitaxial silicon layer. The ohmic contact may be coupled to a lower surface of one of the source or the drain. The first dielectric surface of the one or more dielectric layers may be deposited to contact the bottom bulk surface of the bulk silicon layer. The conductive element may be, for example, metallization that is deposited to contact a lower surface of the ohmic contact. A portion of the conductive element may be exposed at the second dielectric surface of the one or more dielectric layers and may be configured to be coupled to an external component.

A method of fabricating a microelectronic unit according to yet another aspect of the invention may include providing a bulk silicon wafer, growing or depositing a buried oxide layer at an exposed surface of the bulk silicon wafer, epitaxially growing a silicon layer at a top surface of the buried oxide layer, forming a source and a drain by doping portions of the epitaxial silicon layer, removing a portion of the bulk silicon wafer from a bottom surface of the buried oxide layer, forming an ohmic contact extending through the buried oxide layer between the top and bottom surfaces, forming one or more dielectric layers having a first dielectric surface and a second dielectric surface opposite the first dielectric surface, and forming one or more conductive elements extending through the one or more dielectric layer between the first and second dielectric surfaces.

The bottom surface of the buried oxide layer may be adjacent the exposed surface of the bulk silicon wafer. The top surface of the buried oxide layer may be opposite the bottom surface thereof. The back surface of the epitaxial silicon layer may be adjacent the top surface of the buried oxide layer. The front silicon surface of the epitaxial silicon layer may be opposite the back silicon surface thereof. The source and the drain may each extend through the epitaxial silicon layer between the front and back silicon surfaces. The ohmic contact may be in contact with a lower surface of one of the source or the drain. The one or more dielectric layers may be deposited such that the first dielectric surface of the one or more dielectric layers contacts the bottom surface of the buried oxide layer. The conductive element may be, for example, metallization in the one or more dielectric layers that is deposited to contact a lower surface of the ohmic contact. A portion of the conductive element may be exposed at the second dielectric surface of the one or more dielectric layers and may be configured to be coupled to an external component.

A microelectronic assembly according to still another aspect of the invention may include a microelectronic unit and an external component having electrically conductive features at an exposed surface thereof. The microelectronic unit may include an epitaxial silicon layer having a front silicon surface and a back silicon surface opposite the front silicon surface, a buried oxide layer having a top oxide surface and a bottom oxide surface opposite the top oxide surface, an ohmic contact extending through the buried oxide layer between the top and bottom oxide surfaces, one or more dielectric layers having a first dielectric surface and a second dielectric surface opposite the first dielectric surface, and one or more conductive elements extending through the one or more dielectric layers between the first and second dielectric surfaces.

The epitaxial silicon layer may have a source and a drain each extending between the front and back silicon surfaces. The source and the drain may be doped portions of the epitaxial silicon layer. The top oxide surface of the buried oxide layer may be in direct contact with the back silicon surface of the epitaxial silicon layer. The ohmic contact may be coupled to a lower surface of one of the source or the drain. The one or more dielectric layers may be deposited onto the bottom surface of the buried oxide layer. The one or more conductive elements may be, for example, metallizations deposited in the one or more dielectric layers, such that the one or more conductive elements contact a lower surface of the ohmic contact. A portion of the one or more conductive elements may be exposed at the second dielectric surface of the one or more dielectric layers. At least one of the electrically conductive features of the external component may be electrically connected with the one or more conductive elements of the microelectronic unit. The exposed surface of the external component may be directly bonded to the second dielectric surface of the one or more dielectric layers.

DETAILED DESCRIPTION

Figure 2:
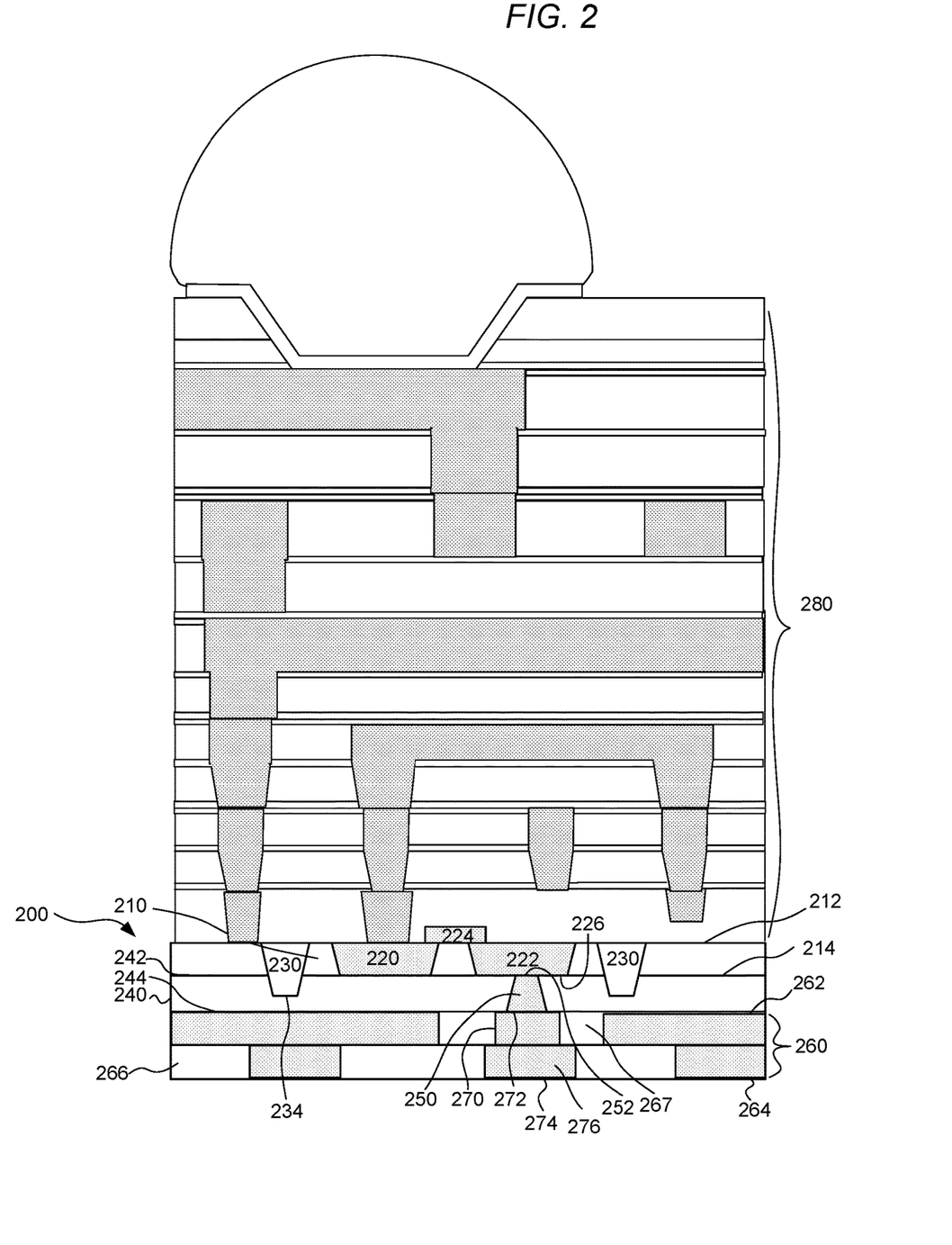
FIG. 2 is a cross-section of a microelectronic element including an FD-SOI transistor according to one embodiment, in which the drain is accessed via a conductive interconnect connected to the backside of the drain.

As illustrated in FIG. 2, a microelectronic unit 200 may comprise one or more fully-depleted silicon-on-insulator transistors. The microelectronic unit 200 may include an epitaxial silicon layer 210 having a front silicon surface 212 and a back silicon surface 214 opposite the front silicon surface. The epitaxial silicon layer 210 may be a layer of silicon that is epitaxially grown.

In FIG. 2, the first and second directions parallel to the front silicon surface 212 of the epitaxial silicon layer 210 are referred to herein as "horizontal" or "lateral" directions, whereas the directions perpendicular to the front silicon surface are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

The epitaxial silicon layer 210 may have a source 220 and a drain 222 each extending between the front and back silicon surfaces 212, 214. The source 220 and the drain 222 may each be doped portions of the epitaxial silicon layer 210. A gate terminal 224 may be above the front silicon surface 212 and over an epitaxial silicon region between the source 220 and drain 222. Activating the gate terminal 224 by applying a voltage to the terminal may couple the source 220 and drain 222 together. The gate terminal 224 may comprise one or more electrically conductive materials, such as a conductor, highly doped silicon, a refractory metal, or a silicide. The gate terminal 224 may be separated from the epitaxial silicon layer and the source 220 and the drain 222 by a dielectric layer (not shown) made, for example, of silicon dioxide.

The microelectronic unit 200 may have an isolation trench 230 extending through the epitaxial silicon layer 210 between the front and back silicon surfaces 212, 214. The isolation trench 230 may be configured to electrically insulate the source 220 and the drain 222 from adjacent portions of the epitaxial silicon layer 210 that may contain adjacent transistors. The isolation trench 230 may comprise one or more dielectric materials (e.g., silicon dioxide) deposited into an opening extending through the epitaxial silicon layer 210. In some examples, the isolation trench 230 may comprise a dielectric coating extending along inner surfaces of the opening, and the remainder of the volume of the opening may be filled with a metal. In some examples, the isolation trench 230 may extend completely around the source 220 and the drain 222 in the first and second directions, for example, in a rectangular or ring shape.

The microelectronic unit 200 may have a buried oxide layer 240 having a top oxide surface 242 and a bottom oxide surface 244 opposite the top surface. The top oxide surface 242 may directly contact the back surface 214 of the epitaxial silicon layer 210. The epitaxial silicon layer 210 may be epitaxially grown on the top oxide surface 242 of the buried oxide layer. The buried oxide layer 240 may comprise silicon dioxide or another dielectric material.

The microelectronic unit 200 may have an ohmic contact 250 extending through the buried oxide layer 240 between the top and bottom oxide surfaces 242, 244. The ohmic contact 250 may be coupled to a lower surface of one of the source 220 and the drain 222. As shown in FIG. 2, the ohmic contact 250 is coupled to a lower surface 226 of the drain 222, but in other examples, the ohmic contact may be coupled to a lower surface of the source 220. The ohmic contact 250 may comprise an electrically conductive metal, such as copper or tungsten. The ohmic contact 250 may be deposited into an opening extending through the buried oxide layer 240. In some examples, the ohmic contact 250 may be coupled to the lower surface of the source or the drain by a layer of silicide (not shown) extending between an upper surface 252 of the ohmic contact and the lower surface of the source or the drain.

The microelectronic unit 200 may have one or more dielectric layers 260 deposited onto the bottom oxide surface 244. The one or more dielectric layers 260 may include a first surface 262 and a second surface 264 opposite the first surface. In the example shown in FIG. 2, the one or more dielectric layers 260 comprises two dielectric layers 266 and 267, although in other examples, the dielectric layers may comprise any number of dielectric layers, such as one, three, four, five, eight, ten, or more than ten.

The one or more dielectric layers may further include a conductive element 270, such as metallization. The conductive element 270 may extend through the one or more dielectric layers 260, such as between the first and second surfaces 262, 264. An interconnection portion 272 of the conductive element 270 may be coupled to a lower surface 254 of the ohmic contact 250 opposite the upper surface 252 as shown in FIG. 2C. A terminal portion 274 of the conductive element 270 may be exposed at the second surface 264 of the one or more dielectric layers 260 and may be configured to be bonded to and electrically connected to an electrically conductive feature of an external component (not shown). The conductive element 270 may include one or more conductive traces 276 extending within at least one of the dielectric layers 266, and the conductive trace may be electrically connected to the terminal portion 274. In some examples, the terminal portion 274 of the conductive element 270 may be a conductive bond pad.

As used in this disclosure with reference to a structure (e.g., the one or more dielectric layers 260), a statement that an electrically conductive element (e.g., the conductive element 270) is "at" a surface or "exposed at" a surface (e.g., the second surface 264) indicates that, when the structure containing the surface is not assembled with any other element, the electrically conductive element is available for contact with a theoretical point moving in a direction perpendicular to the surface of the structure toward the surface of the structure from outside the structure. Thus, a terminal or other conductive element that is at a surface of a structure may project from such surface; may be flush with such surface; or may be recessed relative to such surface in a hole or depression in the structure. In some embodiments, a conductive element at a surface may be attached to the surface or may be disposed in one or more layers of dielectric coating on the said surface.

The microelectronic unit 200 may be bonded to and electrically connected with an external component (not shown), thereby forming a microelectronic assembly. In some examples, the terminal portion 274 of the conductive element 270 may be bonded to an electrically conductive feature of an external component using solder, conductive posts, or other electrically conductive elements. In some examples, the second surface 264 of the one or more dielectric layers 260 may be directly bonded to the external component, for example, using direct dielectric bonding, non-adhesive techniques, such as a ZiBond® direct bonding technique or a DBI® hybrid bonding technique, both available from Invensas Bonding Technologies, Inc. (formerly Ziptronix, Inc.), a subsidiary of Xperi Corp. (see for example, U.S. Pat. Nos. 6,864,585 and 7,485,968, which are incorporated herein in their entirety). Such a direct bonding of the microelectronic unit 200 and an external component may be accomplished without using solder, conductive posts, or other electrically conductive elements that may extend below the second surface 264. In such a direct bonding example, the second surface 264 may be laminated onto a confronting exposed surface of an external component, and heat and pressure may be used to bond the second surface with the confronting exposed surface of the external component.

The microelectronic unit 200 may have a front dielectric layer assembly 280 over the epitaxial silicon layer 210. The front dielectric layer assembly may include a dielectric material such as silicon dioxide, and it may be a passivation layer. The front dielectric layer assembly may be configured to electrically insulate and protect the source 220, the drain 222, and the gate terminal 224. The front dielectric layer assembly may be devoid of electrically conductive elements extending therethrough to the source 220 or the drain 222, since one of the source or the drain is already electrically connected with the terminal portion 274 of the conductive element 270 at the second surface 264 of the rear dielectric layer assembly 260. In other possible embodiments, electrical connection to the top surface of the source 220 or the drain 222 may exist in order to share the source or drain connections with other circuit elements. For example, the source may be driven externally, and the drain may be coupled to the gate of a different transistor.

A method of fabricating the microelectronic unit 200 will now be discussed, with reference to FIGS. 2A-2C. A bulk silicon wafer 202 may be provided. The buried oxide layer 240 may be grown or deposited at an exposed surface 204 of the bulk silicon wafer 202. The bottom surface 244 of the buried oxide layer 240 may be adjacent the exposed surface 204 of the bulk silicon wafer 202. The epitaxial silicon layer 210 may be epitaxially grown at the top oxide surface 242 of the buried oxide layer 240, with the back silicon surface 214 being formed adjacent the top oxide surface of the buried oxide layer.

The source 220 and the drain 222 may be formed by doping portions of the epitaxial silicon layer 210, and the gate terminal 224 may be formed and electrically coupled to the epitaxial silicon to form a transistor with the source 220 and the drain 222. The isolation trench 230 may be formed extending through the epitaxial silicon layer 210 between the front and back silicon surfaces 212, 214. The isolation trench 230 may be formed by depositing one or more dielectric materials into an opening extending through the epitaxial silicon layer 210. The isolation trench 230 may extend completely around the source, drain, and gate terminal in the first and second directions, for example, in a rectangular or ring shape. The isolation trench 230 may completely isolate adjacent transistor structures. In some examples, the isolation trench 230 may be formed by depositing a dielectric coating extending along inner surfaces 234 of the opening, and the remainder of the volume of the opening may be filled with a metal.

Figure 2A:
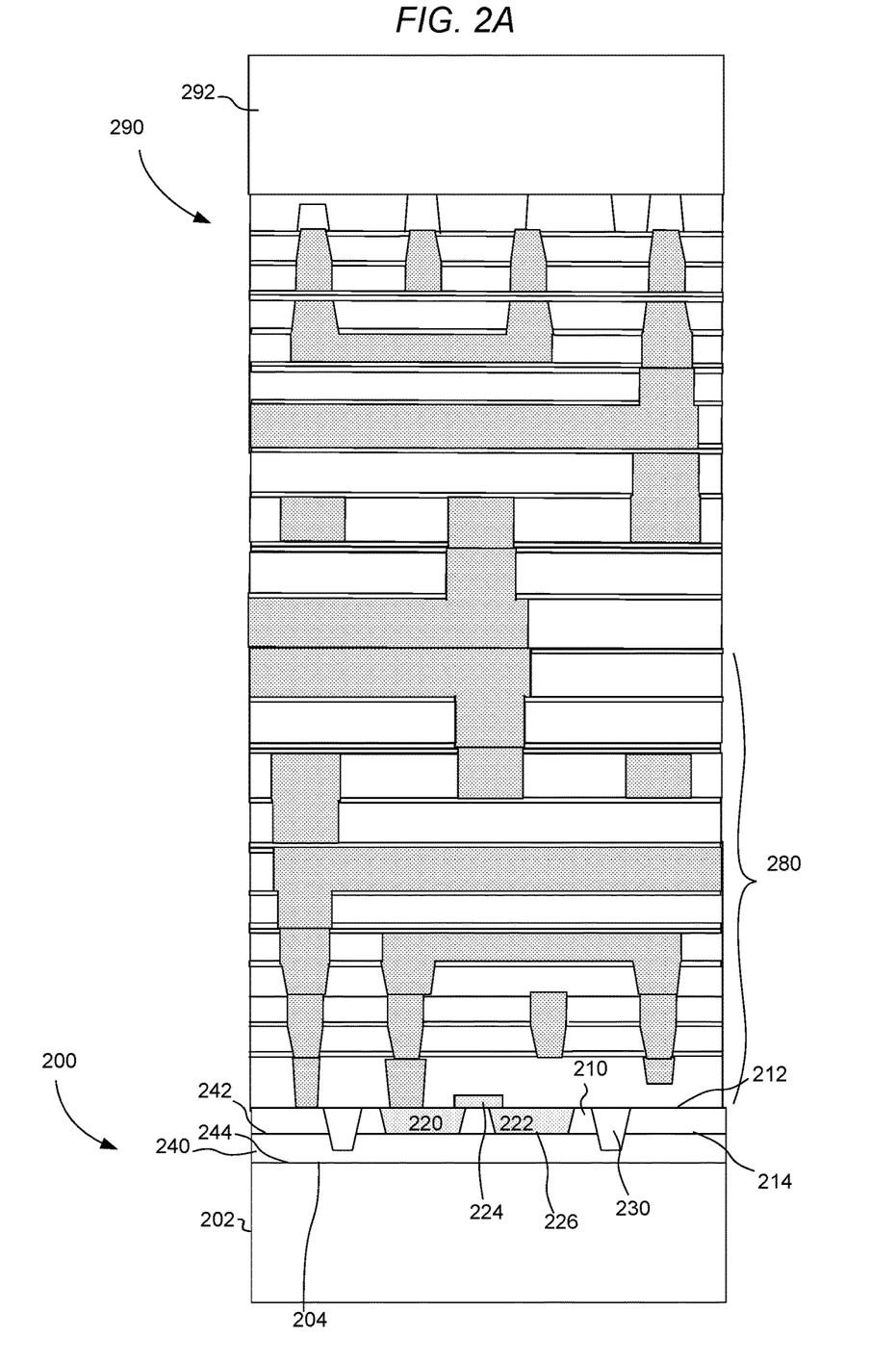
FIGS. 2A-2C illustrate stages of forming the microelectronic element of FIG. 2, wherein FIGS. 2B-2C focus on backside details of forming the microelectronic element.

As shown in FIG. 2A, a plurality of dielectric layers 280 may be added. The unit 200 including the layers 280 may then be bonded to a second unit 290 that includes a second bulk silicon layer 292. The second unit 290 may provide support to the unit 200 during a process of chemical and/or mechanical etching of the bulk silicon wafer 202. The unit 200 including the dielectric layers 280 may be bonded to the second unit 290 using, for example, direct dielectric bonding, non-adhesive techniques, such as a ZiBond® direct bonding technique, or a DBI® hybrid bonding technique, both available from Invensas Bonding Technologies, Inc. (formerly Ziptronix, Inc.), a subsidiary of Xperi Corp. (see for example, U.S. Pat. Nos. 6,864,585 and 7,485,968, which are incorporated herein in their entirety).

In some embodiments, all or a portion of the bulk silicon wafer 202 may be removed from the bottom surface 244 of the buried oxide layer 240, using one or more chemical and/or mechanical processes, such as etching, chemical mechanical planarization ("CMP"), etc. According to some examples, the removal may automatically stop upon reaching the buried oxide layer 240.

Figure 2B:
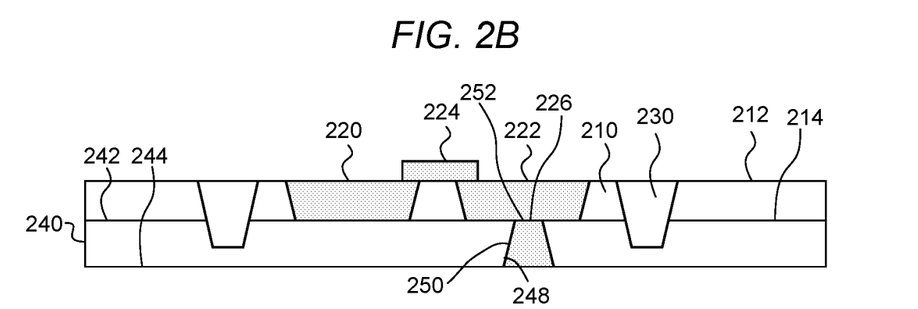
Figure 2C:
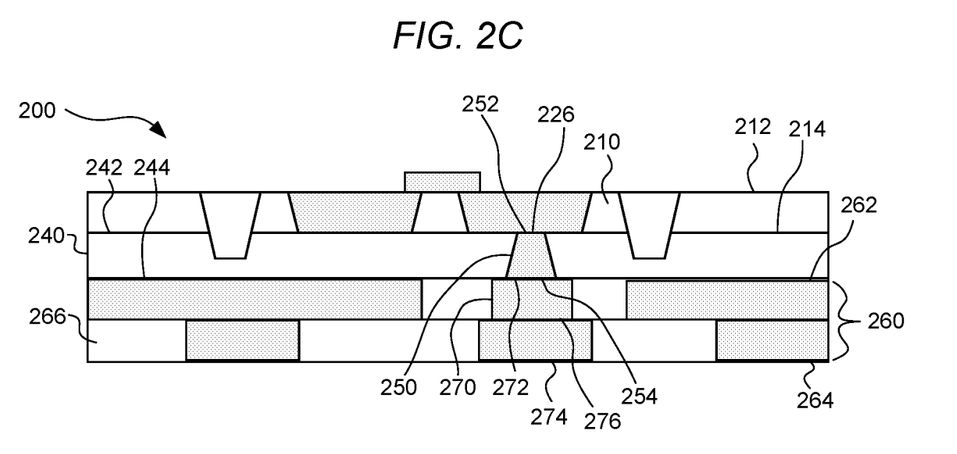

As shown in FIG. 2B, the ohmic contact 250 may be formed extending through the buried oxide layer 240 between the top and bottom oxide surfaces 242, 244, the ohmic contact being coupled to a lower surface of one of the source or the drain. While the second unit 290 and the dielectric layers 280 are not shown in FIGS. 2B-2C, it should be understood that they may nevertheless be present.

In some examples, the ohmic contact 250 may be deposited into an opening extending through the buried oxide layer 240. The opening may be formed by pattern etching the bottom oxide surface 244 of the buried oxide layer 240, for example, using a photoresist to protect the remaining portions of bottom surface. The ohmic contact 250 may be formed by depositing a seed layer along inner surfaces 248 of the opening, and then by depositing the remainder of the electrically conductive material onto the seed layer. In some examples, the ohmic contact 250 may be coupled to the lower surface of the source or the drain by first forming a layer of silicide (not shown) on the lower surface of the source or the drain, and then depositing the metal of the ohmic contact into the opening overlying the layer of silicide.

As shown in FIG. 2C, the one or more dielectric layers 260 may deposited onto the bottom oxide surface 244 of the buried oxide layer 240. The conductive element 270 may be formed extending through the one or more dielectric layers 260 between the first and second dielectric surfaces 262, 264, the conductive element being deposited onto the lower surface 254 of the ohmic contact 250. A terminal portion 274 of the conductive element 270 may be exposed at the second dielectric surface 264.

In the example shown in FIG. 2C, a first one of the dielectric layers 266 may be deposited onto the bottom surface 244 of the buried oxide layer 240. The first dielectric layer may be patterned and etched to create openings, and electrically conductive traces 276 or other portions of the conductive element 270 may be deposited into the openings. A second one of the dielectric layers 266 may be deposited onto an exposed surface of the first dielectric layer. The second dielectric layer may be patterned and etched to create openings, and electrically conductive traces 276 and the terminal portion 274 of the conductive element 270 may be deposited into the openings. Before or after forming of the one or more dielectric layers 260, a front dielectric layer assembly 280 may be formed at the front surface 212 of the epitaxial silicon layer 210.

The microelectronic unit 200 may be bonded to and electrically connected with an external component (not shown), thereby forming a microelectronic assembly. The coupling of the microelectronic unit 200 with an external component may be performed using any of a variety of processes. For example, the microelectronic unit 200 may be bonded in a stacked arrangement with an external component using various bonding techniques, including using direct dielectric bonding, non-adhesive techniques, such as ZiBond® direct bonding technique, or DBI® hybrid bonding technique.

Figure 3:
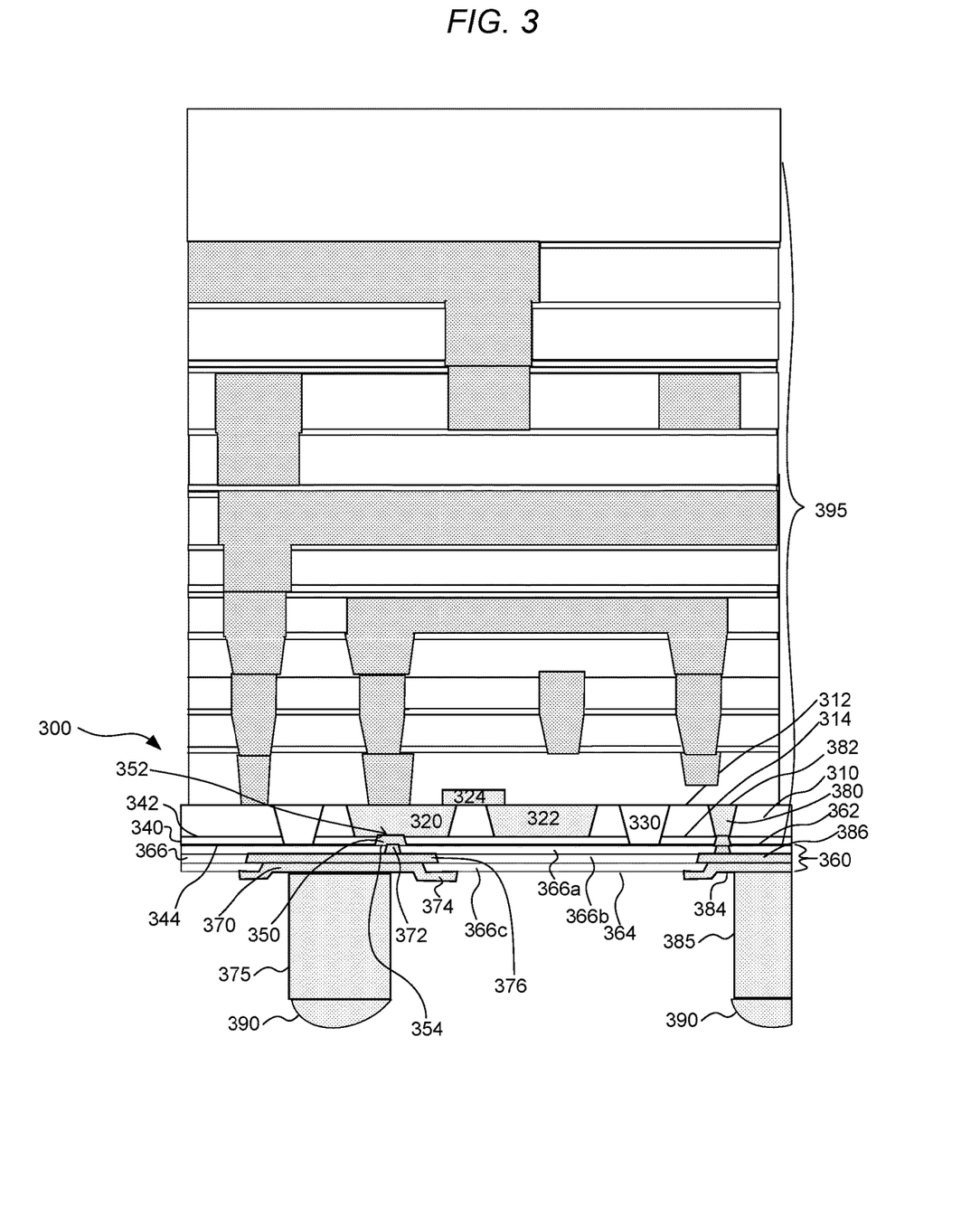
FIG. 3 is a cross-section of a variation of the microelectronic element of FIG. 2, including a bulk silicon layer, in which the source is accessed via a conductive interconnect connected to the backside of the source.

As illustrated in FIG. 3, a microelectronic unit 300 according to a variation of the microelectronic unit 200 may comprise one or more transistors formed in a bulk silicon wafer without a buried oxide layer. The microelectronic unit 300 may include an epitaxial silicon layer 310 having a front surface 312 and a back surface 314 opposite the front surface. The epitaxial silicon layer 310 may be a layer of silicon that is epitaxially grown.

The epitaxial silicon layer 310 may have a source 320 and a drain 322 each extending between the front and back surfaces 312, 314. The source 320 and the drain 322 may each be doped portions of the epitaxial silicon layer 310. A gate terminal 324 may be electrically coupled to epitaxial silicon thus forming a transistor with the source 320 and the drain 322. The gate terminal 324 may comprise one or more electrically conductive materials, such as a conductor, highly doped silicon, a refractory metal, or a silicide. The gate terminal 324 may be separated from the source 320 and the drain 322 by a dielectric layer (not shown) made, for example, of silicon dioxide. According to other examples, the gate terminal may have contacts to a doped region that forms other devices, such as a diode, or forms a part of a routing scheme where a connection through a doped region is desired.

The microelectronic unit 300 may have an isolation trench 330 extending through the epitaxial silicon layer 310, between the front and back surfaces 312, 314. In some examples, where the microelectronic unit does not include an epitaxial layer, the isolation trench may extend lower than the source and drain and be at a depth that would be exposed after backgrind. The isolation trench 330 may comprise one or more dielectric materials (e.g., silicon dioxide) deposited into an opening extending through the epitaxial silicon layer 310. In some examples, the isolation trench 330 may comprise a dielectric coating extending along inner surfaces of the opening, and the remainder of the volume of the opening may be filled with a metal. In some examples, the isolation trench 330 may extend completely around the source 320 and the drain 322 in the first and second directions, for example, in a rectangular or ring shape.

The microelectronic unit 300 may have a thinned bulk silicon layer 340 having a top surface 342 and a bottom surface 344 opposite the top surface. In the illustration of FIG. 3, the thinned bulk silicon layer 340 has been thinned, as discussed further below in connection with FIGS. 3A-3B. The top surface 342 may meet the back surface 314 of the epitaxial silicon layer 310. For example, the epitaxial silicon layer 310 may be epitaxially grown on the top surface 342 of the bulk silicon layer. The isolation trench 330 may extend through the bulk silicon layer 340 as well as the epitaxial silicon layer 310, so that the isolation trench extends between the front surface 312 of the epitaxial silicon layer and the bottom surface 344 of the bulk silicon layer.

The microelectronic unit 300 may have an ohmic contact 350 extending through the thinned bulk silicon layer 340 between the top and bottom surfaces 342, 344. The ohmic contact 350 may be coupled to a lower surface of one of the source 320 and the drain 322. As shown in FIG. 3, the ohmic contact 350 is coupled to a lower surface 326 of the source 320, but in other examples, the ohmic contact may be coupled to a lower surface of the drain 322. The ohmic contact 350 may be deposited into an opening extending through the thinned bulk silicon layer 340. In some examples, the ohmic contact 350 may be coupled to the lower surface of the source or the drain by a layer of silicide (not shown) extending between an upper surface 352 of the ohmic contact and the lower surface of the source or the drain.

The microelectronic unit 300 may have a one or more dielectric layers 360 having a first dielectric surface 362 and a second dielectric surface 364 opposite the first dielectric surface. The first dielectric surface may directly contact the bottom bulk surface 344 of the thinned bulk silicon layer 340. In the example shown in FIG. 3, the one or more dielectric layers 360 comprises three dielectric layers 366, including two upper dielectric layers 366a and 366b comprising silicon dioxide, and one lower dielectric layer 366c comprising silicon nitride at the second surface 364. However, it should be understood that any number of dielectric layers may be used, and the composition of each dielectric layer may vary.

The microelectronic unit 300 may have a conductive element 370 extending through the one or more dielectric layers 360 between the first and second dielectric surfaces 362, 364. An interconnection portion 372 of the conductive element 370 may contact a lower surface 354 of the ohmic contact 350 opposite the upper surface 352. A terminal portion 374 of the conductive element 370 may be exposed at the second dielectric surface 364 of the one or more dielectric layers 360. The terminal portion 374 of the conductive element 370 may include a rigid conductive post 375 extending below the second surface 364 of the one or more dielectric layers 360. The conductive post 375 may be configured to be electrically connected to an electrically conductive feature of an external component (not shown). The conductive element 370 may connect to one or more conductive traces 376 extending within at least one of the dielectric layers 366, and the one or more conductive traces may be electrically connected to the conductive post 375.

The microelectronic unit 300 may also have a conductive interconnect 380 extending from the front silicon surface 312 of the epitaxial silicon layer 310 to the second surface 364 of the one or more dielectric layers 360. The conductive interconnect 380 may be electrically connected with the epitaxial silicon layer 310, but not with the source 320 or the drain 322. A contact portion 382 of the conductive interconnect 380 may be exposed at the front surface 312 of the epitaxial silicon layer 310. A terminal portion 384 of the conductive interconnect 380 may be exposed at the second surface 364 of the rear dielectric layer assembly 360. The terminal portion 384 of the conductive interconnect 380 may include a rigid conductive post 385 extending above the second surface 364 of the rear dielectric layer assembly 360. The conductive post 385 may be configured to be bonded to and electrically connected to an electrically conductive feature of an external component (not shown). The conductive interconnect 380 may include one or more conductive traces 386 extending within at least one of the dielectric layers 366, and the conductive trace may be electrically connected to the conductive post 385.

The microelectronic unit 300 may be electrically connected with an external component (not shown), thereby forming a microelectronic assembly. In some examples, the conductive posts 375 and 385 may be bonded to electrically conductive features of an external component using electrically conductive masses 390, such as masses of a bond metal, e.g., tin, indium, solder or a eutectic material, or a conductive matrix material of metal particles embedded in a polymeric material.

In a variation of the microelectronic unit 300, the conductive posts 375 and 385 may be omitted, and the second dielectric surface 364 of the one or more dielectric layers 360 may directly contact the second surface of the one or more dielectric layers. Such direct contact may be achieved using, by way of example, a direct bonding of the microelectronic unit 300 and an external component. Such direct bonding may be accomplished without using solder, conductive posts, or other electrically conductive elements that may extend above the second surface 364. In such a direct bonding example, the second surface 364 may be laminated onto a confronting exposed surface of an external component, and heat and pressure may be used to bond the second surface with the confronting exposed surface of the external component.

The microelectronic unit 300 may have a front dielectric layer assembly 395 at the front surface 312 of the epitaxial silicon layer 310. The front dielectric layer assembly 395 may include a dielectric material such as silicon dioxide, and it may be a passivation layer. The front dielectric layer assembly 395 may be configured to electrically insulate and protect the source 320, the drain 322, and the gate terminal 324. The front dielectric layer assembly may be devoid of electrically conductive elements extending therethrough to the source 320 or the drain 322, since one of the source or the drain is already electrically connected with the terminal portion 374 of the conductive element 370 at the second surface 364 of the one or more dielectric layers 360.

A method of fabricating the microelectronic unit 300 will now be discussed, with reference to FIGS. 3A and 3B. A bulk silicon wafer 302 may be provided. The epitaxial silicon layer 310 may be epitaxially grown at an exposed surface 304 of the bulk silicon wafer 302, with the back surface 314 of the epitaxial silicon layer being formed adjacent the exposed surface of the bulk silicon wafer.

The source 320 and the drain 322 may be formed by doping portions of the epitaxial silicon layer 310, and the gate terminal 324 may be formed and electrically coupled to the source 320 and the drain 322. The isolation trench 330 may be formed extending through the epitaxial silicon layer 310 between the front and back silicon surfaces 312, 314 and extending into the bulk silicon wafer 302 below the exposed surface 304. The isolation trench 330 may be formed by depositing one or more dielectric materials into an opening extending through the epitaxial silicon layer 310. In some examples, the isolation trench 330 may be formed by depositing a dielectric coating extending along inner surfaces of the opening, and the remainder of the volume of the opening may be filled with a metal.

Figure 3A:
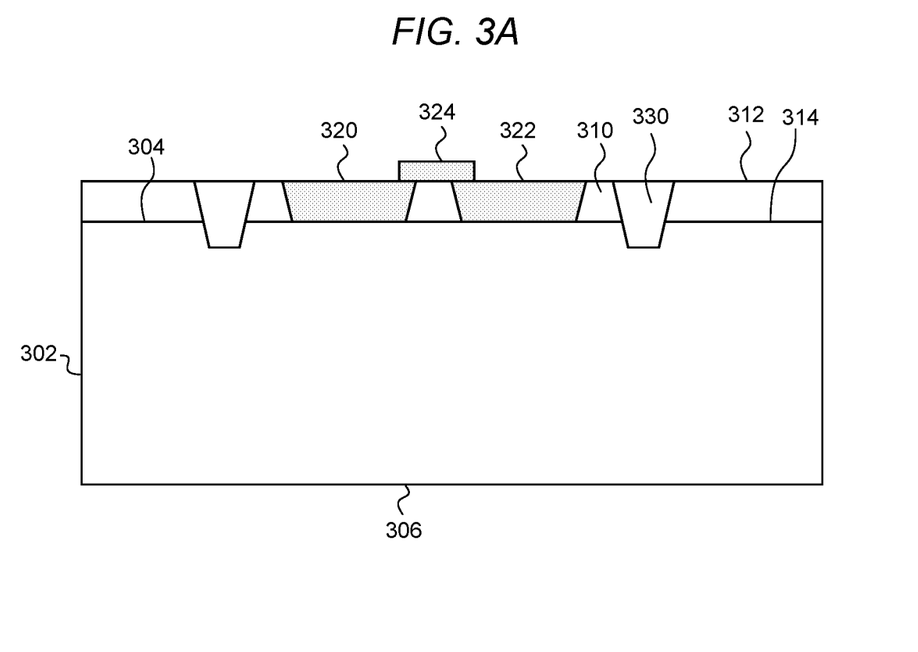
FIGS. 3A and 3B are cross-sections of in-process stages of forming the microelectronic element of FIG. 3.

The resulting in-process structure at this point is shown in FIG. 3A. Though not shown in FIG. 3A, the dielectric layers 395 may be added. Moreover, similar to FIG. 2A, the unit 200 may be bonded to a second unit having another bulk silicon portion to provide stability for a process of removing portions of the bulk silicon wafer 302, as discussed below.

Figure 3B:
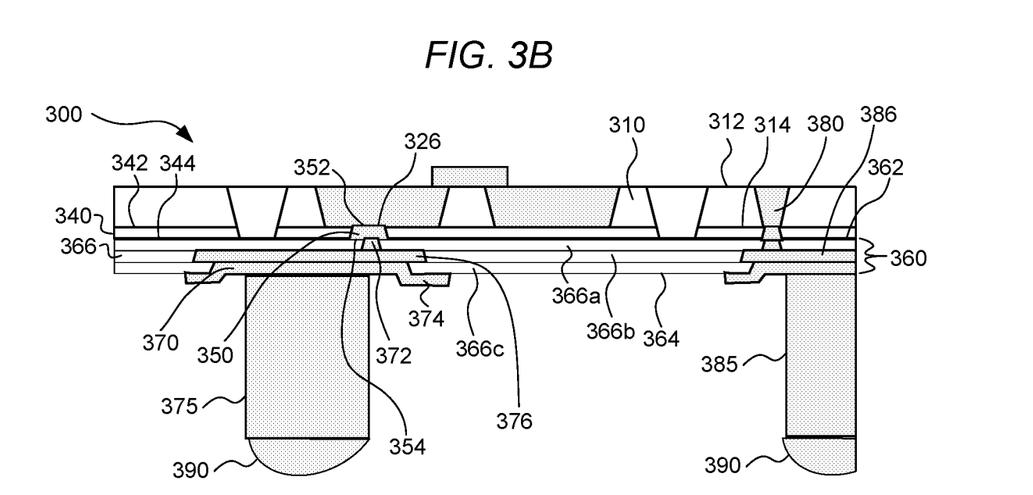

As shown in FIG. 3B, a portion of the bulk silicon wafer 302 may be removed from a second surface 306 of the bulk silicon wafer opposite the exposed surface 304. For example, the bulk silicon wafer 302 may be thinned, such as by using chemical and/or mechanical processes, such as etching, CMP, etc. The remaining portion of the bulk silicon wafer 302 can be seen in FIG. 3B as the thinned bulk silicon layer 340. The ohmic contact 350 may be formed extending through the thinned bulk silicon layer 340 between the top and bottom surfaces 342, 344, the ohmic contact being bonded to a lower surface of one of the source or the drain.

In some examples, the ohmic contact 350 may be deposited into an opening extending through the bulk silicon layer 340. The opening may be formed by pattern etching the bottom surface 344 of the thinned bulk silicon layer 340, using a photoresist to protect the remaining portions of bottom surface. The ohmic contact 350 may be formed by depositing an insulating layer along inner surfaces of the opening, while leaving an end portion of the opening exposed to complete an electrical connection, depositing a seed layer along inner surfaces of the insulating layer, and then by depositing the remainder of the electrically conductive material onto the seed layer. In some examples, the ohmic contact 350 may be coupled to the lower surface of the source or the drain by first forming a layer of silicide (not shown) on the lower surface of the source or the drain, and then depositing the metal of the ohmic contact into the opening overlying the layer of silicide.

The one or more dielectric layers 360 may be formed, for example, by depositing dielectric onto the bottom bulk silicon surface 344 of the bulk silicon layer 340. The conductive element 370 may be formed extending through the one or more dielectric layers 360 between the first and second dielectric surfaces 362, 364, the conductive element being deposited onto the lower surface 354 of the ohmic contact 350. The conductive interconnect 380 may be formed extending from the front silicon surface 312 of the epitaxial silicon layer 310 to the second dielectric surface 364 of the one or more dielectric layers 360.

In the example shown in FIG. 3B, a first one of the upper dielectric layers 366a may be deposited onto the bottom surface 344 of the thinned bulk silicon layer 340. The first dielectric layer may be patterned and etched to create openings, and electrically conductive traces 376, 386 may be deposited into the openings. A second one of the upper dielectric layers 366b may be deposited onto an exposed surface of the first dielectric layer. The second dielectric layer may be patterned and etched to create openings, and electrically conductive traces 376, 386 may be deposited into the openings. Next, the lower dielectric layer 366c may be patterned and etched to create openings, and the conductive posts 375 and 385 may be formed extending above the second surface 364 of the one or more dielectric layers 360. Before or after forming of the one or more dielectric layers 360, a front dielectric layer assembly 380 may be formed at the front surface 312 of the epitaxial silicon layer 310.

The microelectronic unit 300 may be electrically connected with an external component (not shown), thereby forming a microelectronic assembly. In some examples, the conductive posts 375 and 385 may be coupled to electrically conductive features of an external component using electrically conductive masses 390, such as masses of a bond metal, e.g., tin, indium, solder or a eutectic material, or a conductive matrix material of metal particles embedded in a polymeric material.

Figure 4:
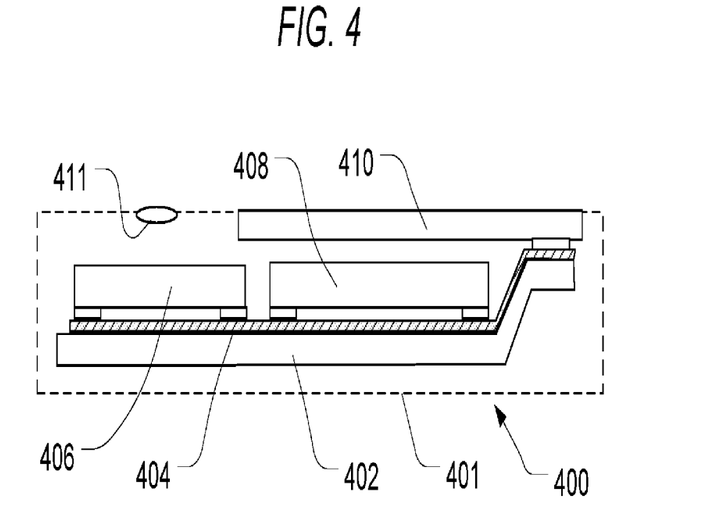
FIG. 4 illustrates an example system according to aspects of the disclosure.

The assemblies described above with reference to FIGS. 2 and 3 above can be utilized in construction of diverse electronic systems, such as the system 400 shown in FIG. 4. For example, the system 400 in accordance with a further embodiment of the invention includes a plurality of modules or components 406 such as the microelectronic elements described above, in conjunction with other electronic components 408, 410 and 411.

In the exemplary system 400 shown, the system can include a circuit panel, motherboard, or riser panel 402 such as a flexible printed circuit board, and the circuit panel can include numerous conductors 404, of which only one is depicted in FIG. 4, interconnecting the modules or components 406, 408, 410 with one another. Such a circuit panel 402 can transport signals to and from each of the microelectronic packages and/or microelectronic assemblies included in the system 400. However, this is merely exemplary; any suitable structure for making electrical connections between the modules or components 406 can be used.

In a particular embodiment, the system 400 can also include a processor such as the semiconductor chip 408, such that each module or component 406 can be configured to transfer a number N of data bits in parallel in a clock cycle, and the processor can be configured to transfer a number M of data bits in parallel in a clock cycle, M being greater than or equal to N.

In the example depicted in FIG. 4, the component 408 is a semiconductor chip and component 410 is a display screen, but any other components can be used in the system 400. Of course, although only two additional components 408 and 411 are depicted in FIG. 4 for clarity of illustration, the system 400 can include any number of such components.

Modules or components 406 and components 408 and 411 can be mounted in a common housing 401, schematically depicted in broken lines, and can be electrically interconnected with one another as necessary to form the desired circuit. The housing 401 is depicted as a portable housing of the type usable, for example, in a cellular telephone or personal digital assistant, and screen 410 can be exposed at the surface of the housing. In embodiments where a structure 406 includes a light-sensitive element such as an imaging chip, a lens 411 or other optical device also can be provided for routing light to the structure. Again, the simplified system shown in FIG. 4 is merely exemplary; other systems, including systems commonly regarded as fixed structures, such as desktop computers, routers and the like can be made using the structures discussed above.

It will be appreciated that the various dependent claims and the features set forth therein can be combined in different ways than presented in the initial claims. It will also be appreciated that the features described in connection with individual embodiments may be shared with others of the described embodiments. For example, the microelectronic unit 200 (FIG. 2) may have its conductive element 270 electrically connected with the source 220, rather than the drain 222. As another example, the microelectronic unit 200 may have rigid posts, similar to the rigid conductive posts 375 and 385 of FIG. 3, extending from the second dielectric surface 264 and configured to join the microelectronic unit with an external component. As a further example, the microelectronic element 200 may have a conductive interconnect extending between the front silicon surface 212 and the second dielectric surface 264, similar to the conductive interconnect 380 (FIG. 3).

In other examples, the microelectronic unit 300 of FIG. 3 may have its conductive element 370 electrically connected with the drain 322, rather than the source 320. Further, the microelectronic unit 300 may be formed without the rigid conductive posts 375 and 385, so that the second dielectric surface 364 can be directly bonded with an exposed surface of an external component, including using direct dielectric bonding, non-adhesive techniques, such as a ZiBond® direct bonding technique, or a DBI® hybrid bonding technique. In some examples, the microelectronic unit 300 may be formed without the conductive interconnect 380, similar to the microelectronic unit 200.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An integrated circuit device, comprising:
   a silicon layer having formed therein a source region and a drain region of a transistor;
   a gate of the transistor and one or more interconnect layers formed over a top side of the silicon layer; and a conductive interconnect structure formed through one or more dielectric layers formed over a bottom side of the silicon layer opposite the top side, wherein one end of the conductive interconnect structure is electrically connected to a bottom surface of one of the source and drain regions through an Ohmic contact, and wherein the other end of the conductive interconnect structure comprises a terminal portion having an exposed surface configured for bonding to an external component, wherein the terminal portion of the conductive interconnect structure comprises a rigid conductive post extending below the one or more dielectric layers.

2. The integrated circuit device of claim 1, wherein a bottom surface of the integrated circuit device includes the exposed surface of the conductive interconnect structure and further includes exposed dielectric surface regions such that the bottom surface of the integrated circuit device is configured for hybrid direct bonding to the external component.

3. The integrated circuit device of claim 2, wherein the conductive interconnect structure is configured to electrically connect to the transistor for externally driving the one of the source and drain regions using driver circuitry in the external component.

4. The integrated circuit device of claim 1, wherein the source and drain regions have a vertical depth extending across an entire thickness of the silicon layer.

5. The integrated circuit device of claim 1, wherein the silicon layer is fully depleted.

6. The integrated circuit device of claim 1, wherein the silicon layer is a silicon layer of a silicon-on-insulator (SOI) substrate, and wherein the one or more dielectric layers comprise a buried oxide layer of the SOI substrate from which a bulk substrate material has been removed.

* * * * *